United States Patent [19]

Su

[11] Patent Number: 5,323,037
[45] Date of Patent: Jun. 21, 1994

[54] LAYERED CAPACITOR STRUCTURE FOR A DYNAMIC RANDOM ACCESS MEMORY DEVICE

[75] Inventor: Wen-Doe Su, Hsinchu, Taiwan

[73] Assignee: Industrial Technology Research Institute, Hsinchu, Taiwan

[21] Appl. No.: 42,642

[22] Filed: Apr. 5, 1993

Related U.S. Application Data

[62] Division of Ser. No. 732,165, Jul. 18, 1991, Pat. No. 5,223,448.

[51] Int. Cl.$^5$ ............................................. H01L 21/70
[52] U.S. Cl. ...................................... 257/306; 257/308
[58] Field of Search ................................. 257/306, 308

[56] References Cited

U.S. PATENT DOCUMENTS

| | | | |
|---|---|---|---|
| 4,910,566 | 3/1990 | Ema | 257/306 |
| 4,951,175 | 8/1990 | Kurosawa et al. | 257/306 |
| 4,974,040 | 11/1990 | Taguchi et al. | 257/306 |

*Primary Examiner*—Robert Limanek
*Attorney, Agent, or Firm*—George O. Saile; Wolmar J. Stoffel

[57] ABSTRACT

An improved method and resulting structures for producing a layered capacitor structure of memory cell of a DRAM device wherein a doped polysilicon spacer operates as a dopant source for an overlying polysilicon layer on the vertical and sharply inclined surfaces.

7 Claims, 4 Drawing Sheets

LAYERED CAPACITOR STRUCTURE FOR A DYNAMIC RANDOM ACCESS MEMORY DEVICE

This is a divisional of 07/732,165 filed Jul. 18, 1991 now U.S. Pat. No. 5,223,448.

BACKGROUND OF THE INVENTION

1. Field of the Invention

The present invention relates generally to dynamic random access memory devices, and more specifically to improvements in producing a layered capacitor structure for a random access memory cell.

2. Description of the Prior Art

As is well known, a memory cell used in a dynamic random access memory device (DRAM), is composed of a memory cell capacitor, such as a stacked capacitor, and a transfer transistor. In order to reduce the cost, and increase the speed of operation, the memory devices have become increasingly more miniaturized. In order to achieve this, each memory cell must occupy less space on the device. However, the cell capacitor must have roughly the same capacitance. The capacitance of a capacitor is proportional to the area of the electrodes. Thus, in order to maintain the capacitance level as the allotted area on the device becomes smaller, various new types of capacitors have been introduced, such as trench capacitors, stacked capacitors and similar devices.

U.S. Pat. No. 4,910,566 discloses an improved cell capacitor for a DRAM cell. In general, the patent discloses a memory cell capacitor consisting of a plate shaped film and a vertical projection film which are formed of doped polysilicon. The plate-shaped film and vertical projection film are formed on an interlayer insulation film. The vertical projection film is in contact with a sidewall of the plate-shaped film. With the vertical projection film, it is possible to increase the capacitance of the memory cell capacitance.

FIGS. 1 and 2 depict the general nature of the capacitor known in the prior art. In FIG. 2, a transfer transistor is shown consisting of a source 10 and drain 12, and a gate electrode 14. An insulating film 16 extends over the gate electrode. Opposite the transistor is shown a thick field oxide 18, and a gate electrode 20 of an adjacent memory cell, with an overlying insulating film 16. Positioned between the electrodes 14 and 20 is the cell capacitor consisting of a polysilicon layer formed of a horizontal plate portion 22 joined to a vertical projection portion 24. A thin insulation layer 26 overlays the cell capacitor.

The cell capacitor of U.S. Pat. No. 4,910,566 suffers from very serious shortcomings in that fabrication, as described, requires a very precise mask adjustment to form the opening over the drain region. Particularly for deep submicron technology, the tight control requirement of this patent will be more critical in order to keep the proper alignment. Also the concentrations of the dopant in the vertical projection portions 24 is low due to the limitation of ion implantation.

SUMMARY OF THE INVENTION

It is a general object of the invention to provide an improved process for fabricating a cell capacitor for a DRAM device.

A more specific object of the invention is to provide a new method to provide a polysilicon layer structure of a cell capacitor for a DRAM device, which requires a minimum of photo-lithographic masking steps, and also provides a more uniform dopant concentration in the polysilicon layer.

A further object of this invention is the achievement of an overhead FIN structure to increase the capacitance by using a silicon oxide instead of the first polysilicon layer and etching of the silicon oxide. The polysilicon spacer enhances the stability of the FIN and word line, as dopant source at the vertical sidewall.

The above objects of the present invention can be achieved by forming a first polysilicon layer over at least the surface of drain region, the gate electrode of the transfer transistor, and the adjacent field oxide, forming an opening in the first polysilicon layer over the drain region. depositing a second doped polysilicon layer, forming an insulating layer over the second polysilicon layer, exposing the device to a reactive ion etch to remove the insulating layer on the horizontal surface, but leaving portions on vertical and sharply inclined surfaces, removing the portions of the second polysilicon layer not masked by the insulating layer, removing the insulating layer, opening the window to the drain region, depositing a third polysilicon layer and ion implanting a dopant therein, and removing the portions of the first and third polysilicon layers not required for the capacitor.

Other objects, features and advantages of the present invention will become apparent from the following detailed description, when read in conjunction with the accompanying drawings.

BRIEF DESCRIPTION OF THE DRAWINGS

FIG. 3 through 9 is a sequence of cross sectional views that depict the process steps of the first embodiment method of the inventions.

FIG. 6b is a cross sectional view taken on line 6b–6b in FIG. 6a.

FIG. 9 is a schematic cross-sectional view of the final device structure after passivation and metallurgy has been formed over the device structures for a second embodiment.

DESCRIPTION OF THE PREFERRED EMBODIMENTS

Figure 1:
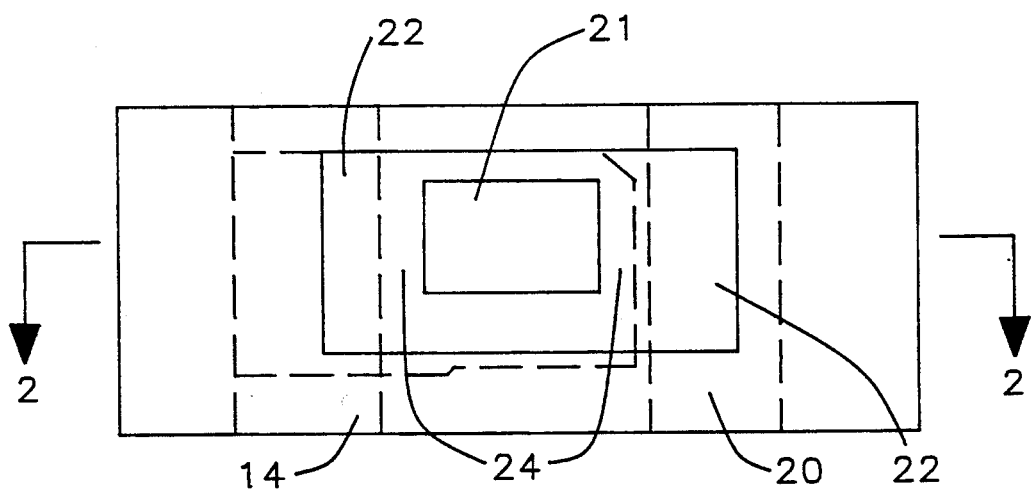
FIG. 1 is a top plan view of a cell capacitor known to the prior art.
Figure 2:
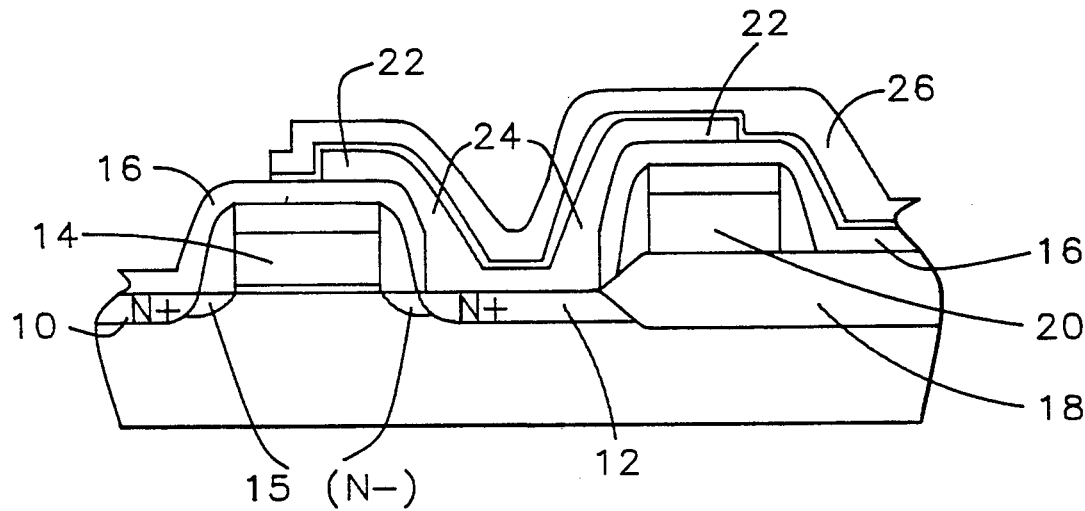
FIG. 2 is an elevational view in cross section taken on line 2—2 of FIG. 1.
Figure 3:
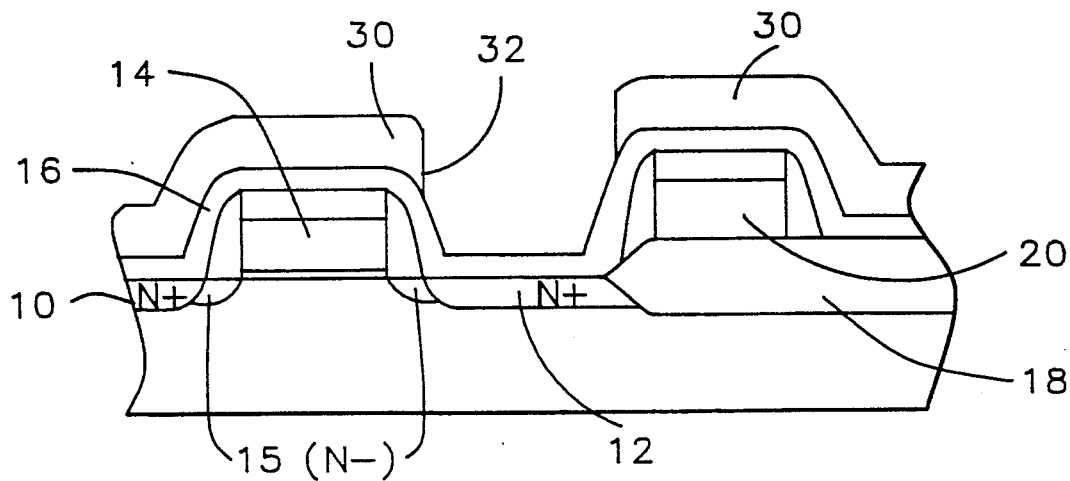

Referring to the drawings, and in particular to FIG. 3, there is shown a partially completed DRAM cell having a transistor, having a source region 10, a drain region 12, a gate oxide 13, and a gate electrode 14. As shown the drain region abuts a thick field oxide region 18. An insulation film 16 is shown covering the surface of the device, including a gate electrode 20 for an adjacent cell that overlays field oxide 18. Thus far, the described cell structure is conventional. Preferably, lightly doped regions 15 are provided adjacent to the source and drain regions 10 and 12, respectfully, as is well known in the art.

In forming the cell capacitor, a first polysilicon layer 30 is deposited on the top surface of the device, using conventional techniques. The thickness of layer 30 will depend on the scale of the device structure, but in general is in the range of about 100 to 500 nanometers.

After depositing layer 30, an opening 32 is formed over region 12, using conventional photolithographic and masking techniques. Preferably the opening 32 is formed by a commercially available plasma dry etcher with significantly high polysilicon to silicon oxide selectivity and preferably higher than 20 to 1.

Figure 4:
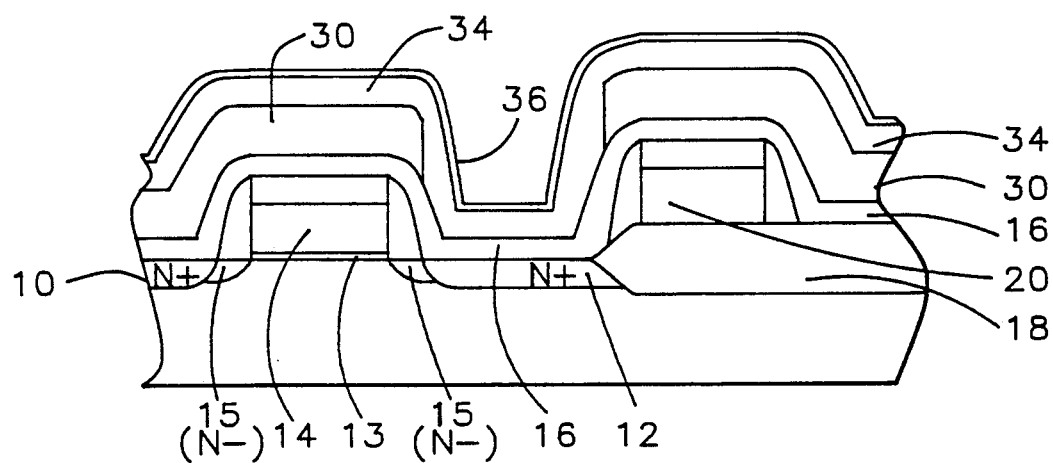

As shown in FIG. 4, a second doped polysilicon layer 34 is deposited over layer 30, and over exposed insulation film 16, over drain region 12. The thickness of layer 34 is preferably in the range of about 100 to 400 nanometers. The dopant, preferably is phosphorus in situ doped with a concentration in the range of about $1 \times 10^{20}$ to $8 \times 10^{20}$ atoms/cm$^3$. The dopant in layer 34 is combined in the reactants that are used to deposit the polysilicon material, as is well known. Thereafter, insulation layer 36 is formed on the surface of polysilicon layer 34. Preferably the layer is silicon oxide formed by oxidizing polysilicon layer 34.

Figure 5:
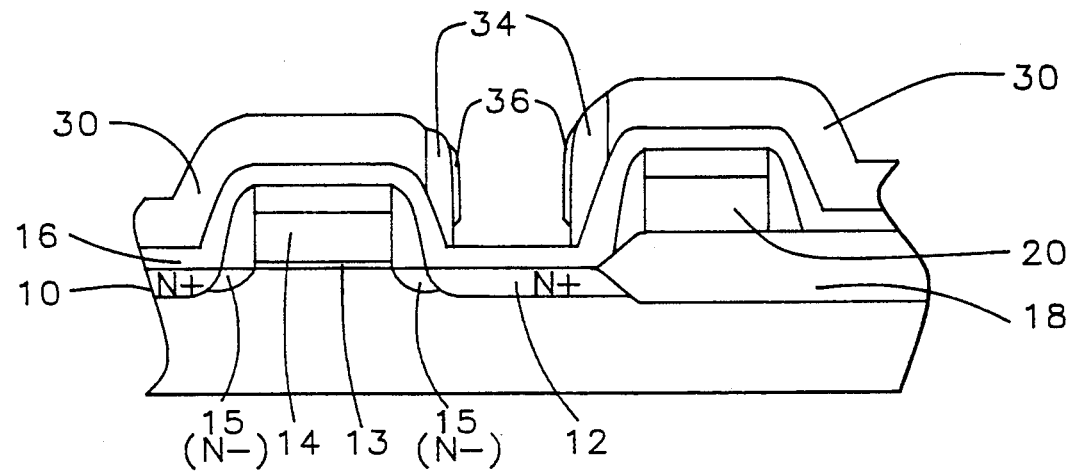

As indicated in FIG. 5, silicon dioxide layer 36 is removed from the device by reactive ion etching techniques. All of the portions of layer 36 on the horizontal surfaces are removed. However, since the etching is anisotropic and directional, the layer portions on the vertical and sharply inclined surfaces remain. Thereafter, the polysilicon layer 34 is removed by chemical or dry etching. The portions of layer 34 underlying the remaining silicon dioxide layer portions 36 on the vertical walls remains because it is masked. Preferably the layer 36 is removed by anisotropic reactive ion etching with CHF$_3$ and oxygen as the etching ambient. Preferably the entire thickness of the exposed portions of layer 36 is removed, possibly even a portion of underlying layer 30. In this operation the insulation film 16 is exposed over the drain region 12.

Figures 6A, 6B:
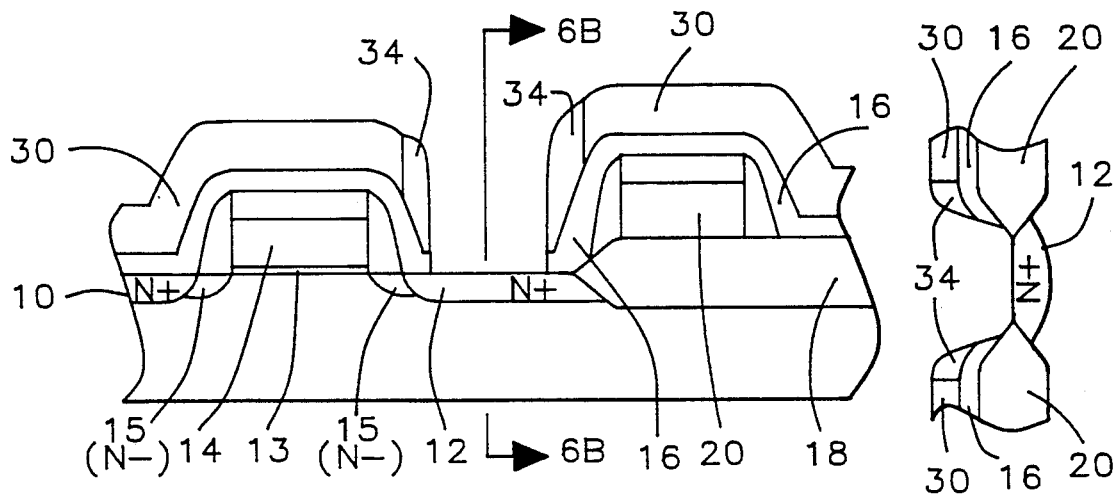

Referring now to FIG. 6a, the exposed layer 16, over the drain region 12, and the portions of silicon dioxide layer 36, on the sidewalls, are removed. No masking operations are required for this operation. The silicon dioxide layer 36 can preferably be removed by wet or vapor isotropic chemical etching. The exposed portion of layer 16 is preferably removed by reactive ion etching, or even by vapor HF due to the masking of tho polysilicon layer all over the wafer.

Figure 7:
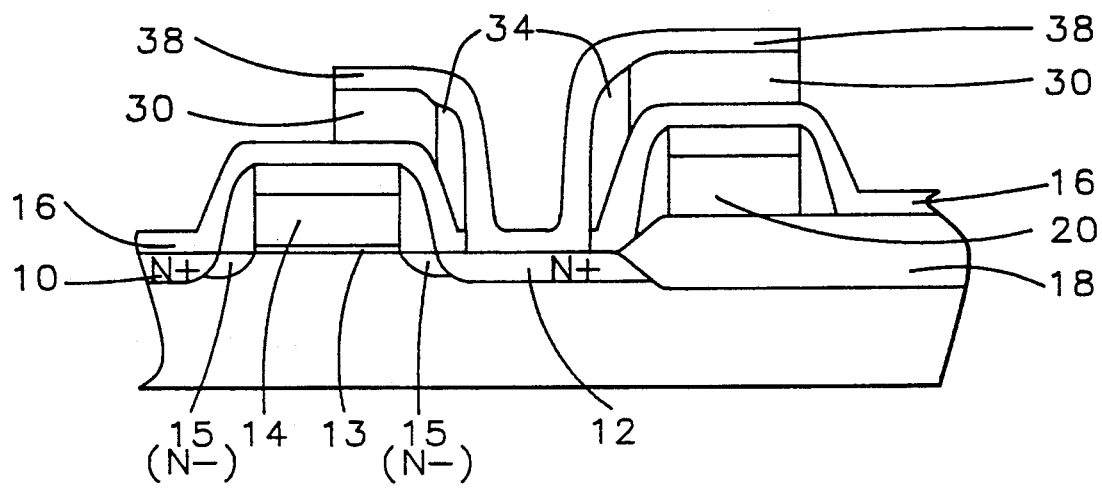

As indicated in FIG. 7, a third polysilicon layer 38 is deposited over the surface of the device. The layer 38 preferably has a thickness in the range of about 50 to 200 nanometers. Layer 38 makes electricalcontact to drain region 12 through the opening previously formed, in layer 16. A suitable dopant, such as arsenic is then ion implanted into layer 38 by standard techniques. Subsequently, the polysilicon layer 38 is masked to cover the desired cell capacitor area, indicated in FIG. 7, and the exposed area removed by the conventional use of a commercial dry etcher. The underlying exposed portions of polysilicon layer 30 are also removed at this time.

The ion implantation of layer 38 effectively introduces the selected dopant into the horizontal portions of layer 38. However, the vertical or sharply inclined area portions do not receive sufficient dopant ions because the ions travel in a vertical direction. However, the portions of doped polysilicon layer 34 are located on the vertical and sharply inclined surfaces underlying polysilicon layer 38, where there is a lack of dopants. When the device is heated, the impurities from layer 34 will outdiffuse into layer 38 thereby providing the dopants needed in the vertical and sharply inclined areas. The thermal treatment will be performed following oxidation of silicon nitride to make capacitor dielectric (ONO). The temperature will be about 900° C. and the time will be about 1 hour in a preferred wet oxygen ambient, but a dry oxygen ambient is also operable.

Figure 8:
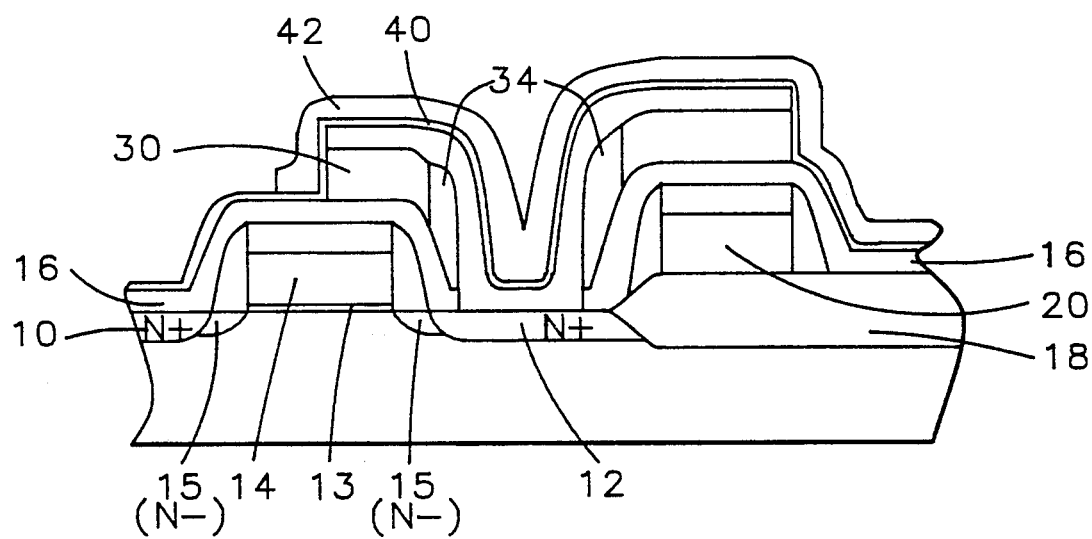
Figure 9:
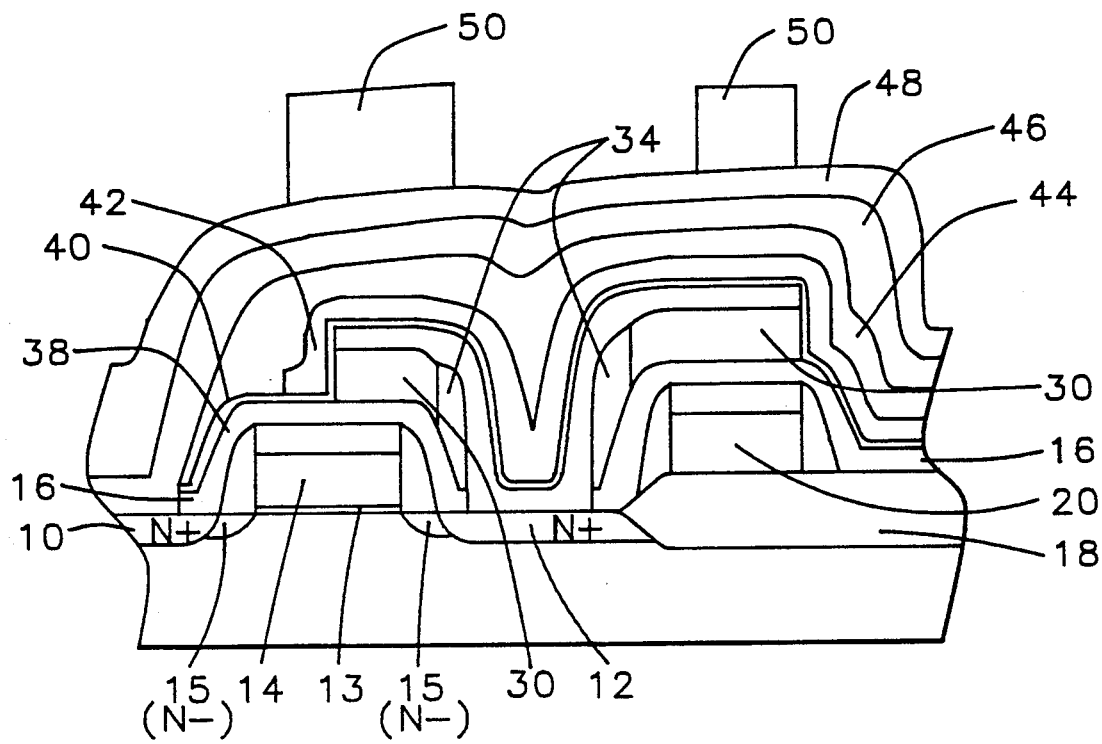

As indicated in FIG. 8, an insulating layer 40 is deposited over the surface of the device to electrically isolate the resultant cell capacitor. This layer 40 can be of any suitable material, but is preferably a composite layer of silicon oxide, silicon nitride and silicon oxide, which is called for short ONO. The layer preferably has a total thickness in the range of 4 to 10 nanometers. A polysilicon layer 42 can be deposited over layer 40 and defined by conventional lithographic techniques to make the capacitor plate 42. The device is then completed by fabricating word lines, passivation layers. and metallurgy to result in the FIG. 9 structure.

A dielectric layer 44 such a silicon oxide and borophosphosilicate glass is deposited by conventional chemical vapor deposition using TEOS. Boron and phosphorus are added to the ambient during the formation of the borophosphosilicate glass layer. The layer 44 is flowed for planarization purposes by heating it to a temperature of about 850° C. for about 30 minutes.

Thereafter, the bit line contact 45 is defined by conventional lithography and dry etching techniques. The bit line metallurgy 46 is now deposited by conventional techniques. Typically, the stacked structure of polysilicon and metal silicide material, such as chemically vapor deposited (CVD) tungsten silicide will be used as the bit line material 46. In order to reduce the contact 45 resistance and bit line sheet resistance, ion implantation of phosphorus at an energy of about 80 KEV with dosage of about 6 E 15 is made into the polysilicon material layer. After the polycide layer 46 is defined, a dielectric layer 48, such as borophosphosilicate glass is formed by CVD TEOS and thermally treated at a temperature of 850° C. for 30 minutes to cause flow and planarization. Suitable contact openings (not shown) are made through the layer 48 to the polycide layer 46. Then the metal layer 50, which can be aluminium or aluminium-copper is deposited by conventional techniques and patterned to complete FIG. 9. The device is then completed by deposition of the conventional passivation and metallurgy layers as are conventional in the art.

The polysilicon spacer 34 not only can work as a self-aligned cell contact etching mask to reduce one mask and also can further reduce the tight requirement of cell contact alignment minimization. For 0.5 micrometer technology, the cell alignment can be released to 0.9 micrometers with the 0.2 micrometer polysilicon spacer 34. The fabrication feasibility will thereby be increased.

Figure 10:
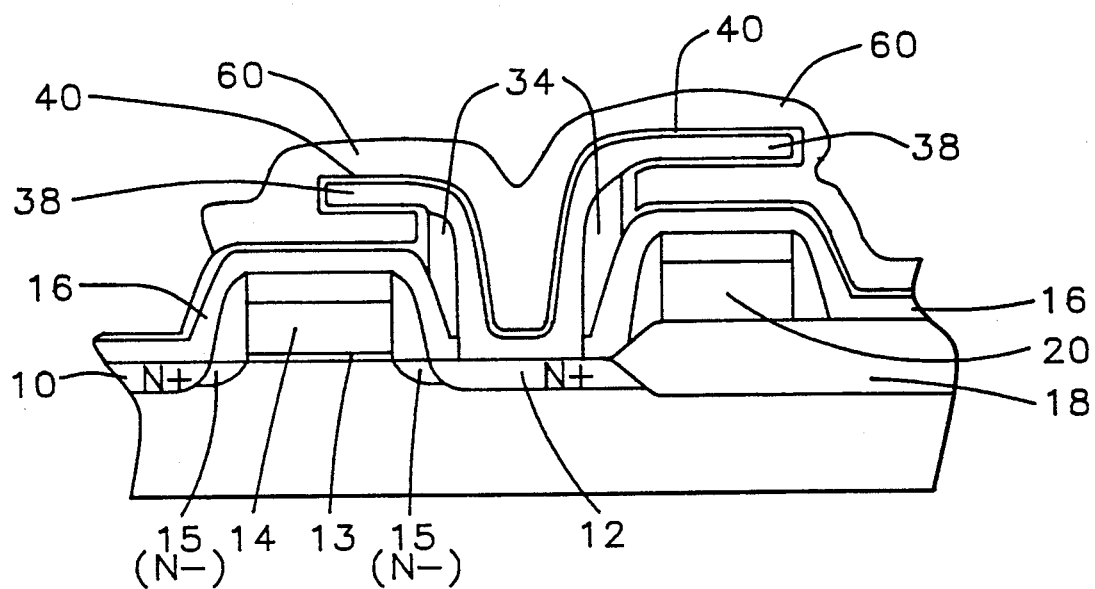
FIG. 10 is a cross-sectional view of a second embodiment of the invention which embodies a capacitor fin structure.

Furthermore, as seen in the FIG. 10 embodiment a silicon nitride and silicon oxide stacked layer can also be used instead of polysilicon layer 30, as shown in FIG. 3–9 embodiment. After the patterning of the polysilicon layers 38 and underlying layers of silicon oxide and silicon nitride, the silicon oxide layer can be etched using the silicon nitride under the silicon oxide layer as the etching mask to protect insulation film 16 to leave an overhead of polysilicon layer 38 as shown, in FIG. 10. Then, all the procedures continues as described above in regard to FIGS. 8 and 9 including deposition of layer 40, and conductive layer 60 beneath layer 38, to complete the FIG. 10 embodiment which has the FIN capacitor structure.

While the invention has been particularly shown and described with reference to the preferred embodiments thereof, it will be understood by those skilled in the art that various changes in form and details may be made without departing from the spirit and scope of the invention.

What is claimed is:

1. A layer structure of a submicrometer memory cell for a dynamic random access memory device having reduced manufacturing tolerances comprising:

a semiconductor substrate;

an insulation film formed on the semiconductor substrate having a first contact window of a given width through which a surface of a semiconductor substrate is partially exposed;

a first conductive film on said insulation film having a second window with a width greater than said given width that is centered over said first window;

a second conductive film formed on the insulation film and in abutting relation to said second window so as to surround the said first contact window and form a third window above the first window, the first window formed in the insulation film having a given width which is substantially the same as the width of the third window formed in the second conductive film;

said second conductive film is composed of one distinct portion which is on the substantially vertical portions of said second contact window in said first conductive film and a second distinct portion which is on the surrounding horizontal portions of the said first contact window;

a third conductive film having a substantially uniform impurity concentration throughout and formed so as to be in contact with both said portions of the second conductive film, and the semiconductor substrate through the first and third windows, the first, second, and third conductive films constitution a storage electrode of a memory cell capacitor;

a dielectric film formed so as to cover the storage electrode; and a fourth conductive film formed so as to cover the dielectric film and complete said memory cell capacitor.

2. The layer structure of claim 1 wherein all said conductive films are formed of polysilicon.

3. The layer structure of claim 2 wherein the said one and second distinct portions of said second conductive layer are different in thickness.

4. A layer structure of a submicometer memory cell for a dynamic random access memory device having reduced manufacturing tolerances comprising:

a semiconductor substrate;

an insulation film formed on the semiconductor substrate having a first window through which a surface of the semiconductor substrate is partially exposed;

a first conductive film formed on the insulation film so as to surround the contact window and form a second window above the first window, the first window formed in the insulation film having a width which is substantially the same as a width of the second window formed in the first conductive film;

said first conductive film is only located upon the substantially vertical portions of said first contact window;

a second conductive film having a substantially uniform concentration throughout and formed so as to be in contact with said first conductive film, and the semiconductor substrate through the first and second windows, the first and second conductive films constituting a storage electrode of a memory cell capacitor;

said second conductive film is undercut at its extremities;

a dielectric film formed so as to cover the storage electrode including the said undercut portion of said second conductive film; and a third conductive film formed so as to cover the dielectric film and complete said memory cell capacitor.

5. The layer structure of claim 4 wherein all said conductive films are formed of polysilicon.

6. The layer structure of claim 4 wherein said first conductive layer has a second distinct portion contiguous and on the horizontal surfaces surrounding the vertical layer which portions are different in thickness.

7. The layer structure of claim 6 wherein said undercut at the extremities of said second conductive layer at the expense of a part of said second distinct portion of said first conductive layer.

* * * * *